United States Patent
Tailor

(10) Patent No.: US 11,942,325 B2
(45) Date of Patent: Mar. 26, 2024

(54) TRANSISTOR STRUCTURE WITH GATE OVER WELL BOUNDARY AND RELATED METHODS TO FORM SAME

(71) Applicant: GlobalFoundries U.S. Inc., Malta, NY (US)

(72) Inventor: Ketankumar Harishbhai Tailor, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 81 days.

(21) Appl. No.: 17/647,195

(22) Filed: Jan. 6, 2022

(65) Prior Publication Data

US 2023/0215731 A1   Jul. 6, 2023

(51) Int. Cl.
| | |
|---|---|
| H01L 27/06 | (2006.01) |
| H01L 21/02 | (2006.01) |
| H01L 21/266 | (2006.01) |
| H01L 21/3215 | (2006.01) |
| H01L 29/66 | (2006.01) |

(52) U.S. Cl.
CPC ........ *H01L 21/266* (2013.01); *H01L 21/0257* (2013.01); *H01L 21/3215* (2013.01); *H01L 27/0617* (2013.01); *H01L 29/66803* (2013.01)

(58) Field of Classification Search
CPC .............. H01L 29/06; H01L 29/66803; H01L 29/0617; H01L 21/0257; H01L 21/3215; H01L 21/266; H01L 27/0617
See application file for complete search history.

(56) References Cited

U.S. PATENT DOCUMENTS

| | | |
|---|---|---|
| 7,405,443 B1 | 7/2008 | Zuniga et al. |
| 7,462,906 B2 | 12/2008 | Lu et al. |
| 8,541,848 B2 | 9/2013 | Huang et al. |
| 8,790,966 B2 | 7/2014 | Zhang et al. |
| 8,963,241 B1 | 2/2015 | Khemka et al. |
| 9,184,252 B2 | 11/2015 | Chuang et al. |
| 9,219,147 B2 | 12/2015 | Toh et al. |
| 9,590,053 B2 | 3/2017 | Chou et al. |

(Continued)

FOREIGN PATENT DOCUMENTS

CN   111092123 A   5/2020

OTHER PUBLICATIONS

K. Mistry et al., "A 45nm Logic Technology with High-k+Metal Gate Transistors, Strained Silicon, 9 Cu Interconnect Layers, 193nm Dry Patterning, and 100% Pb-free Packaging," IEEE 2007, 4 pages.

(Continued)

*Primary Examiner* — Farun Lu
*Assistant Examiner* — Sandra Milena Rodriguez Villanu
(74) *Attorney, Agent, or Firm* — Anthony Canale; Hoffman Warnick LLC

(57) ABSTRACT

A transistor structure is disclosed. The transistor structure includes a dielectric layer that has a thinner portion over a first doped well and a second doped well, and a thicker portion adjacent the thinner portion and over the second doped well. The thicker portion has a height greater than the thinner portion above the doped wells. The transistor includes a first gate structure on the thinner portion and a second gate structure on the thicker portion of the dielectric layer. The transistor may include a third gate structure on the thicker portion.

20 Claims, 17 Drawing Sheets

(56) References Cited

U.S. PATENT DOCUMENTS

| | | | |
|---|---|---|---|
| 9,793,281 | B2 | 10/2017 | Su et al. |
| 9,871,132 | B1 | 1/2018 | Liu et al. |
| 9,905,687 | B1 | 2/2018 | Zhu et al. |
| 9,954,097 | B2 | 4/2018 | Chou et al. |
| 10,636,904 | B2 | 4/2020 | Chou et al. |
| 11,158,737 | B2 | 10/2021 | Jin et al. |
| 2009/0108350 | A1* | 4/2009 | Cai .................... H01L 29/7848 257/E29.295 |
| 2018/0261676 | A1* | 9/2018 | Sonsky ............. H01L 29/42368 |
| 2019/0027585 | A1 | 1/2019 | Wei et al. |
| 2019/0221666 | A1 | 7/2019 | Bang et al. |
| 2019/0334032 | A1 | 10/2019 | Ho et al. |
| 2019/0363186 | A1 | 11/2019 | You et al. |
| 2020/0013888 | A1 | 1/2020 | Su et al. |
| 2020/0126990 | A1 | 4/2020 | Zhang |
| 2020/0168603 | A1* | 5/2020 | Chuang ................ H01L 21/266 |
| 2021/0036112 | A1 | 2/2021 | Xu |
| 2021/0234042 | A1 | 7/2021 | Xu |
| 2021/0376148 | A1* | 12/2021 | Lee .................... H01L 29/7816 |

OTHER PUBLICATIONS

U.S. Patent Application titled: "Structure and Method to Provide Conductive Field Plate Over Gate Structure," filed Sep. 23, 2020, 36 pages.

U.S. Patent Application titled: "Integrated Circuit Structure with Metal Gate and Metal Field Plate Having Coplanar Upper Surfaces," filed Mar. 19, 2021, 31 pages.

Non Final Office Action dated Dec. 13, 2021 for U.S. Appl. No. 17/029,446, filed Sep. 23, 2020; pp. 15.

U.S. Appl. No. 17/206,195, Office Action dated Mar. 29, 2022, 19 pages.

U.S. Appl. No. 17/029,446, Final Office Action dated Apr. 5, 2022, 12 pages.

* cited by examiner

US 11,942,325 B2

TRANSISTOR STRUCTURE WITH GATE OVER WELL BOUNDARY AND RELATED METHODS TO FORM SAME

BACKGROUND

The present disclosure relates to integrated circuits, and more specifically, to an integrated circuit structure including a transistor structure with a first gate structure over a first doped well, a second doped well, and a well boundary. The structure may be employed, for example, in an extended drain metal-oxide semiconductor (EDMOS) transistor setting.

In planar field effect transistor (FET) structures, the proximity of gate contacts to other conductors may lead to unwanted parasitic capacitance or conduction, i.e., leakage, between these adjacent structures. This situation can adversely affect structural performance or yield. Some FETs are integrated into high voltage (HV) IC structures for handling high voltage input/output ("I/O") signals (e.g., those between one-hundred volts (V) and one-thousand V). Forming a gate structure for an HV IC structure can be challenging without creating the noted undesirable outcomes such as short circuits. Forming a gate structure formation with compatible materials using a gate-last formation approach is a technical challenge.

SUMMARY

An aspect of the disclosure is directed to a transistor structure, including: a doped well region within a substrate, the doped well region including a first doped well abutting a second doped well at a boundary. The first doped well has an opposite doping type from the second doped well. A dielectric layer, including: a first portion over the first doped well, the second doped well, and the boundary and having a first height above the doped well region, and a second portion adjacent the first portion and over the second doped well, and having a second height above the doped well region greater than the first height. A first gate structure on the first portion of the dielectric layer and over the boundary between the first doped well and the second doped well, and a second gate structure on the second portion of the dielectric layer and over the second doped well.

Another aspect of the disclosure includes a transistor structure, including: a doped well region within a substrate, the doped well region including a first doped well abutting a second doped well at a boundary. The first doped well has an opposite doping type from the second doped well. A dielectric layer, including: a first portion over the first doped well, the second doped well, and the boundary and having a first height above the doped well region, and a second portion adjacent the first portion and over the second doped well, and having a second height above the doped well region greater than the first height. A first gate structure on the first portion of the dielectric layer and over the boundary between the first doped well and the second doped well. A second gate structure on the second portion of the dielectric layer and over the second doped well. A third gate structure on the second portion of the dielectric layer and over the second doped well. The second gate structure is laterally positioned between the first gate structure and the third gate structure.

An aspect of the disclosure related to a method including: forming a transistor structure including forming a doped well region within a substrate, the doped well region including a first doped well abutting a second doped well at a boundary, wherein the first doped well has an opposite doping type from the second doped well. Forming a dielectric layer, including: a first portion over the first doped well, the second doped well, and the boundary and having a first height above the doped well region, and a second portion adjacent the first portion and over the second doped well, and having a second height above the doped well region greater than the first height. Forming a first gate structure on the first portion of the dielectric layer and over the boundary between the first doped well and the second doped well; and forming a second gate structure on the second portion of the dielectric layer and over the second doped well.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
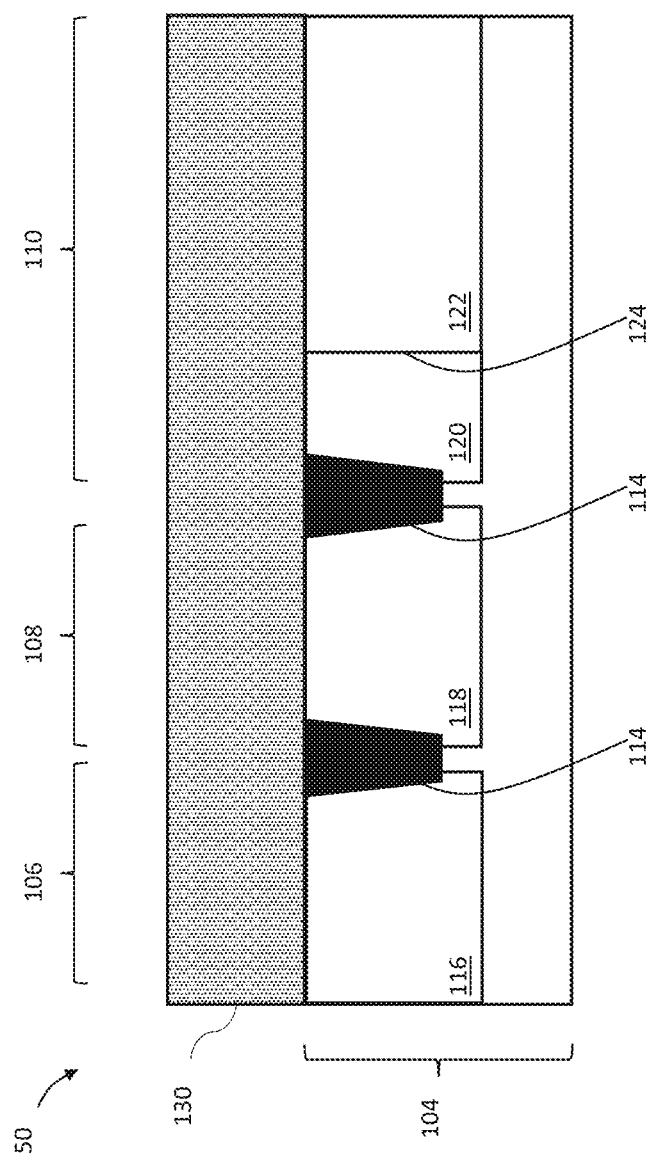
FIG. 1 shows a cross-sectional view of a preliminary structure to be processed, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

An integrated circuit (IC) structure according to the disclosure may provide, e.g., a transistor structure including a gate structure and a drain extension region extending laterally from under the gate structure to a drain region. The transistor structure includes a dielectric layer with a thicker portion and a thinner portion. A first gate structure is over at least the thinner portion of the dielectric layer, a first doped well, a second doped well, and a boundary. A second gate structure is over the thicker portion of the dielectric layer and the second doped well. The second gate structure may include an insulative material, such as a masking material, on the thicker portion of the dielectric layer. The transistor structure may have a third gate structure over the thicker portion of the dielectric layer and the second doped well. The third gate structure may include a control/switching gate to improve performance of the transistor structure.

Referring to FIG. 1, a preliminary structure 50 to form an IC structure according to embodiments of the disclosure is shown. Preliminary structure 50 may be processed as described herein to yield an IC structure including an extended drain metal oxide semiconductor (EDMOS) transistor structure according to embodiments of the disclosure. However, it is understood that other techniques, ordering of processes, etc., alternatively may be implemented to yield an IC structure according to the disclosure. FIG. 1 shows a cross-section view of preliminary structure 50 with a substrate 104, e.g., one or more semiconductor materials. Substrate 104 may include but is not limited to silicon, germanium, silicon germanium, silicon carbide, or any other common IC semiconductor substrates. A portion or entire semiconductor substrate 104 may be strained.

For purposes of reference, three regions 106, 108, 110 for different types of transistor structures are illustrated. Each region may be electrically isolated from another by respective trench isolations 114 (two shown). Each trench isolation 114 may include a trench etched into substrate 104 and filled with an insulating material such as oxide, insulative semiconductor, etc., to isolate one region of the substrate from an adjacent region of the substrate. One or more transistor structures of a given polarity may be disposed within each region 106, 108, 110 and isolated from others by trench isolations 114. Semiconductor substrate 104 may include a variety of doped wells therein for formation of different polarity transistors. Region 106 includes, for example, an n-well 116 in substrate 104 for providing a p-type low voltage metal oxide semiconductor (LV PMOS) transistor 172A (FIGS. 12-17). Region 108 includes, for example, a p-well in substrate 104 for a n-type low voltage metal oxide semiconductor (LV NMOS) transistors 172B (FIGS. 12-17). Doped well region 110 includes, for example, a first doped well 120 adjacent a second doped well 122 at a well boundary 124 in substrate 104 for transistor structure 200 (FIGS. 12-17). First doped well 120 includes a first dopant type and second doped well 122 includes a second dopant type opposite the first dopant type. Each well may be formed using any appropriate n-type or p-type dopant and may be formed using any now known or later developed technique (e.g., in-situ doping or ion implantation). The opposite doping polarities in each well 120, 122 may define a "P-N junction" across well boundary 124. The term "P-N" refers to two adjacent materials having different types of conductivity (i.e., P-type and N-type), which may be induced through dopants within the adjacent material(s).

Preliminary structure 50 may include a dielectric layer 130 over substrate 104. Dielectric layer 130 may be formed, e.g., by depositing any now known or later developed high dielectric constant (high-K) material (K value of at least approximately 3.9) typically used for gate dielectrics such as but not limited to metal oxides such as: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity), or a combination of these materials. Dielectric layer 130 formation additionally may include depositing a thermal oxide such as not limited to: silicon oxide ($SiO_2$), silicon nitride ($Si_3N_4$), silicon oxynitride (SiON) or any combination of these materials.

As used herein, "depositing" may include any now known or later developed techniques appropriate for the material to be deposited including but are not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Dielectric layer 130 may be deposited, for example, using ALD.

Figure 2:
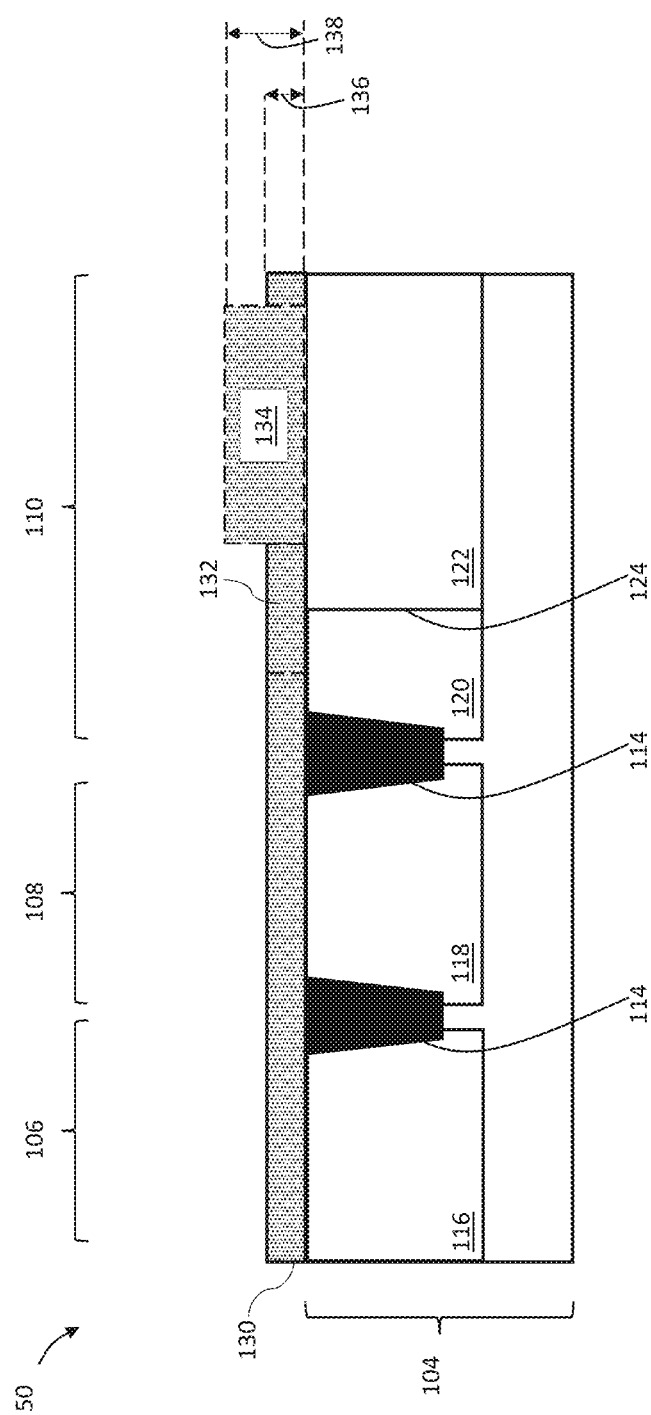
FIG. 2 shows a cross-sectional view of processing a dielectric layer according to embodiments of the disclosure.

Referring now to FIG. 2, embodiments of the disclosure may include removing portions of dielectric layer 130 using, e.g., a mask (not shown) with an opening at a targeted position to expose dielectric layer 130. This removal process may include, forming a mask patterned to expose selected portion(s) of dielectric layer 130. Masks may include any now known or later developed appropriate masking material, e.g., a nitride hard mask. Any appropriate etching process, e.g., a reactive ion etch (RIE), can remove selected portion(s) of dielectric layer 130. As shown in FIG. 2, continued processing may include removing portions of dielectric material layer 130 to yield a first portion 132 of dielectric layer 130 adjacent to a second portion 134 of dielectric layer 130. First portion 132 of dielectric layer 130 is over first doped well 120, second doped well 122, and well boundary 124. First portion 132, moreover, has a first height 136 above doped well region 110. Second portion 134 of dielectric layer 130 is over second doped well 122 and has a second height 138 above doped well region 110 that is greater than first height 136 above doped well region 110. Forming dielectric layer 130 may include forming a first mask patterned to recess dielectric layer 130 to second height 138 and forming a second mask patterned to expose portions of dielectric layer 130 to reduce said portions to first height 136. Where portions 132, 134 have a substantially uniform composition, they may be distinguished from one another based on their relative heights and horizontal positions. First portion 132 may not necessarily include the same materials, e.g., first portion 132 may include a thermal oxide and second portion 134 may include a high voltage gate oxide (HVGOX). In another example, second portion 134 may include multiple materials, e.g., it may include an upper portion that includes HVGOX and a lower portion that includes thermal oxide.

As discussed herein, dielectric layer 130 may be formed in part by etching. Etching generally refers to the removal of material from a substrate (or structures formed on the substrate) and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive ion etching (RIE) operates under conditions intermediate between sputter and plasma etching and may be used to produce deep, narrow features, such as STI trenches.

Figure 3:
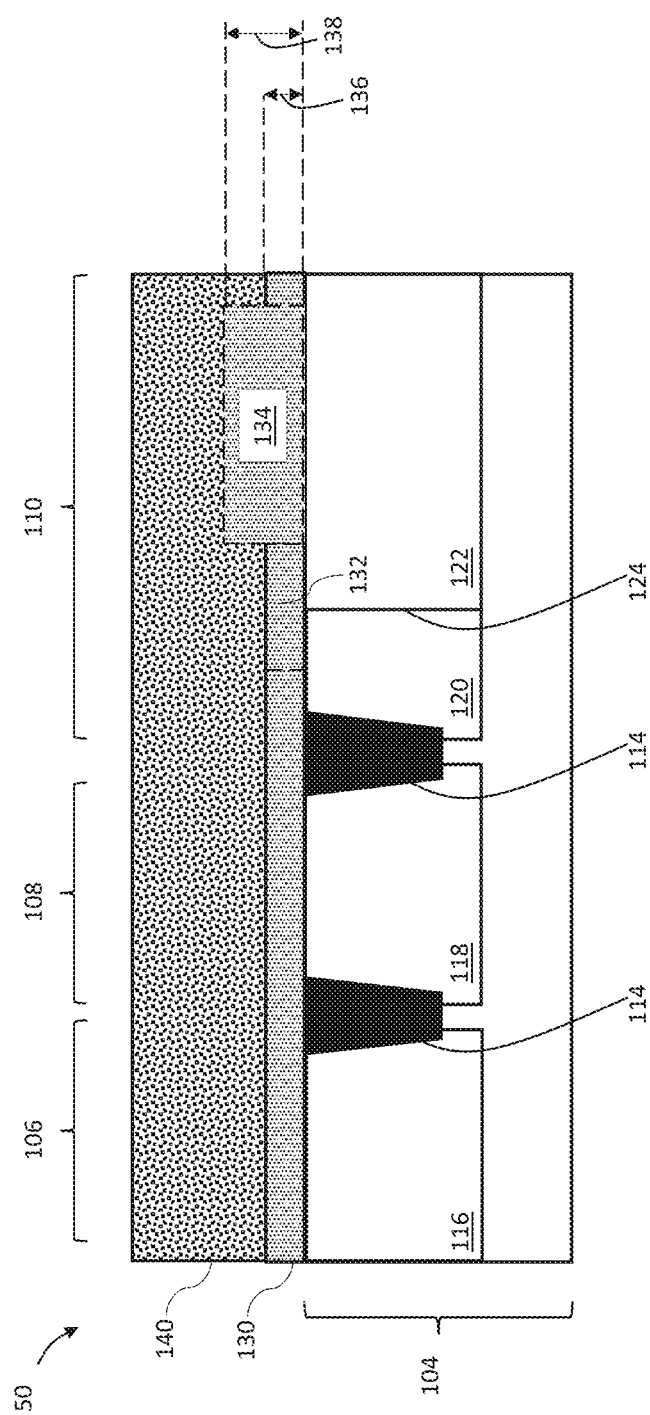
FIG. 3 shows a cross-sectional view of forming an insulative material layer according to embodiments of the disclosure.
Figure 4:
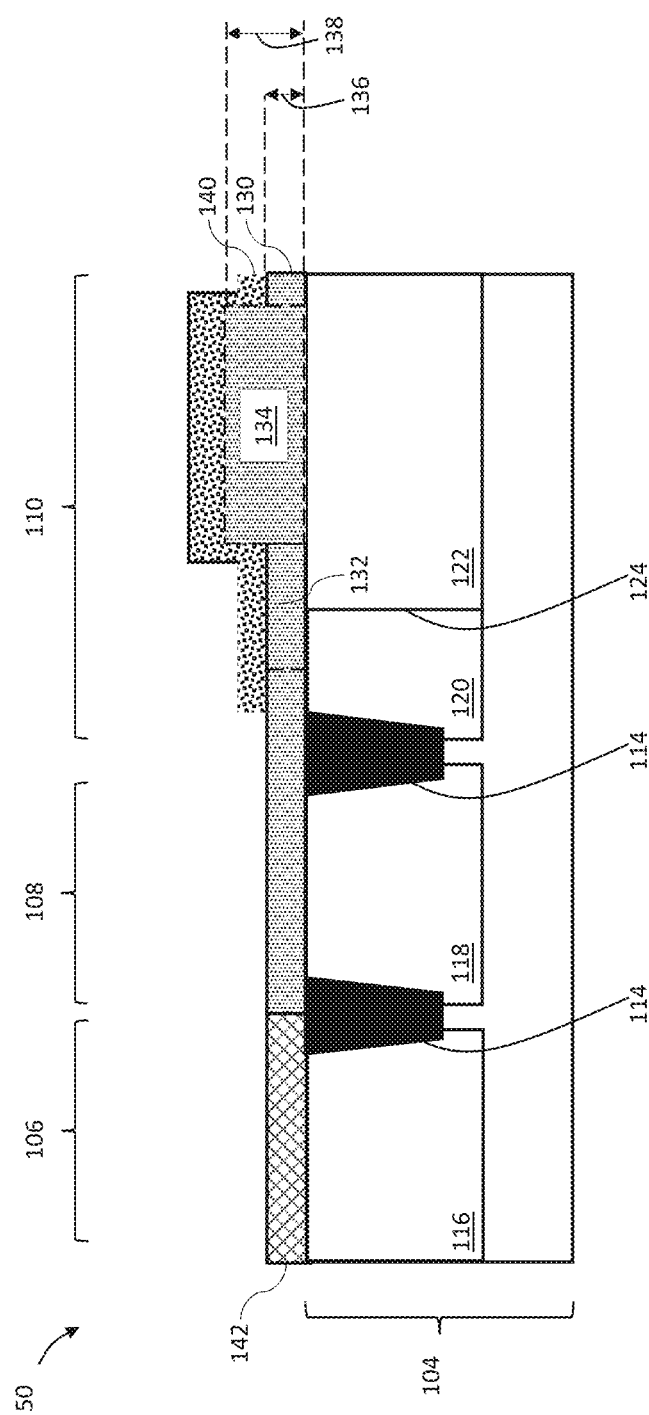
FIG. 4 shows a cross-sectional view of processing an insulative material layer according to embodiments of the disclosure.

Referring now to FIG. 3, embodiments of the disclosure may include depositing an insulative material 140 over dielectric layer 130. Insulative material 140 may include any now known or later developed appropriate masking material, e.g., a nitride hard mask. Depositing insulative material 140 may be targeted and removed from certain areas of the substrate, while leaving the material unaffected, in other areas of the substrate. Additional processing may include selectively removing insulative material 140 from portions of dielectric layer 130. For example, as shown in FIG. 4, embodiments of the disclosure may include selectively removing portions of insulative material 140 over regions 106, 108. Insulative material 140 may remain on first and second portions 132, 134 of dielectric 130 over doped well region 110 to prevent exposure of first and second portions 132, 134 from subsequent processing. Additional processing may include forming a material layer 142 over region 116. Material layer 142 may include, for example, silicon germanium (SiGe) and be useful to forming LV PMOS transistors 172A (FIGS. 12-17) after subsequent processing.

Figure 5:
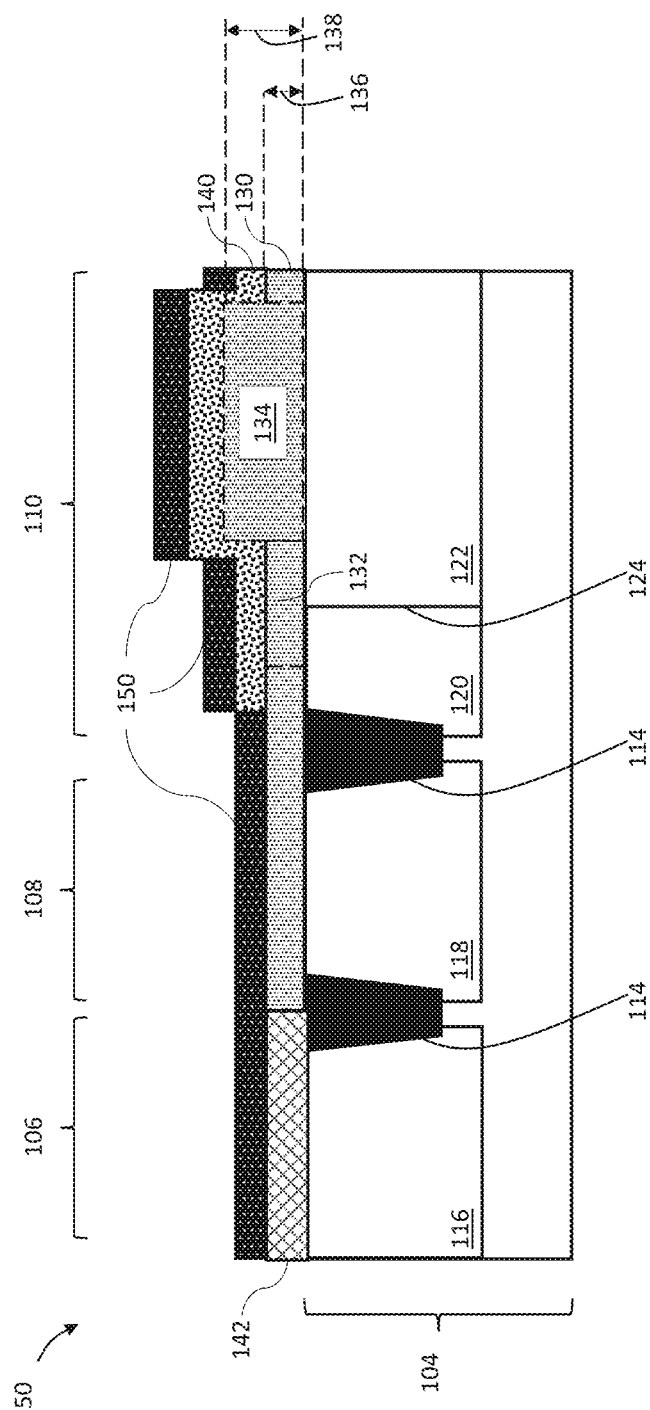
FIG. 5 shows a cross-sectional view of forming a high-k metal gate layer according to embodiments of the disclosure.
Figure 6:
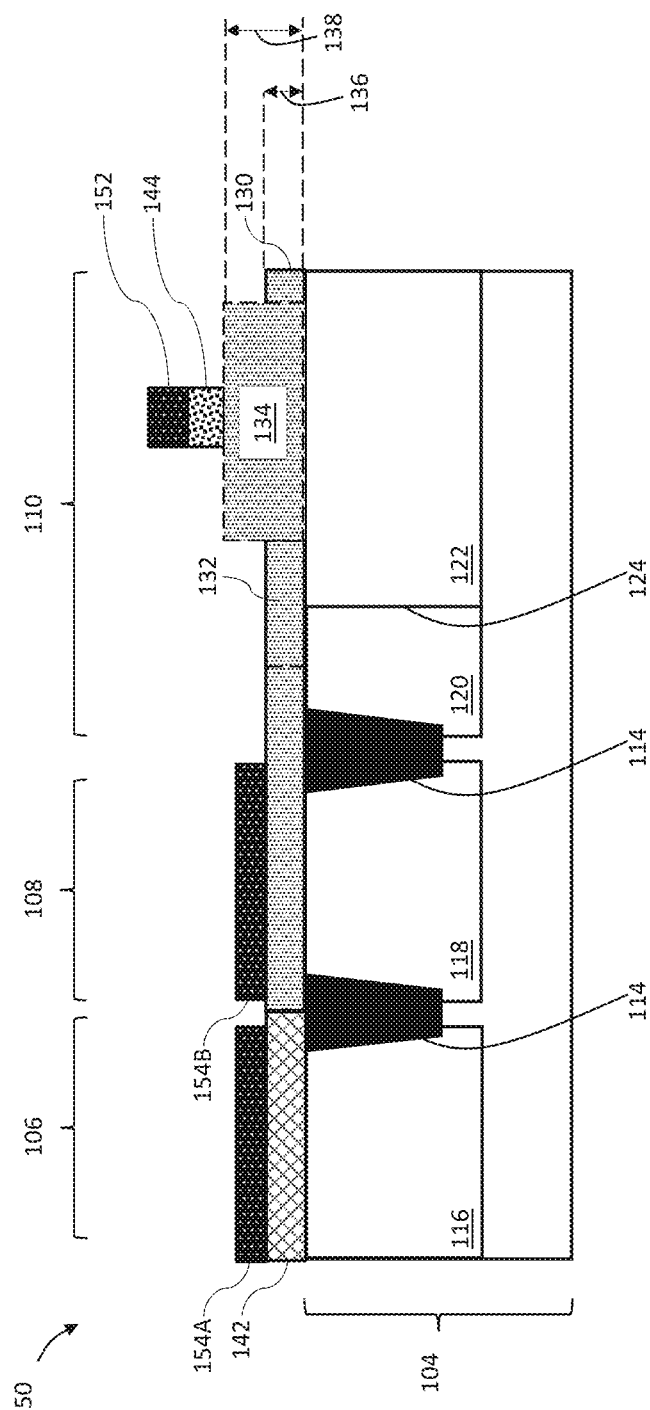
FIG. 6 shows a cross-sectional view of processing a high-k metal gate layer according to embodiments of the disclosure.

Referring now to FIG. 5, embodiments of the disclosure may include forming a high-K material layer 150 on any exposed materials to cover dielectric material layer 130, insulative material 140, and material layer 142. High-K material layer 150 formation may include depositing a conformal layer of a high-K dielectric material typically used for gate dielectric layers. As shown in FIG. 6, embodiments of the disclosure may include processing high-K material layer 150 to yield one or more material layers 152, 154A, 154B. Material layers 152, 154A, and 154B are high-K metal gate (HKMG) layers. Forming HKMG layers may include depositing a first work function metal (WFM) layer over high-K material layer 150 and using, e.g., a mask to expose a target portion(s) of first WFM layer to selectively remove (e.g., etching) exposed target portion(s) of first WFM layer from high-K material layer 150 (not shown). The method may further include depositing a second WFM layer over exposed target portion(s) of high-K material layer 150. Subsequent processing may include applying a heat treatment (e.g., annealing) to embed the first and second WFM layers within the high-K material layer 150. First WFM layer may include one of a p-type or n-type WFM. Second WFM layer may include one of a p-type or n-type WFM different than the type of first WFM layer. The method may further include depositing a metal layer (not shown) such as, e.g., titanium nitride (TiN), over high-K material layer 150 embedded with first and second WFM layers.

As shown in FIG. 6, embodiments of the disclosure may include processing high-K material layer 150 to yield material layers 152, 154A, 154B that each include either a p-type or n-type WFM embedded within a high-K dielectric material. Material layers 152, 154A, 154B may also each include a metal layer such as, e.g., TiN, over the high-K dielectric material embedded with a WFM. In the present embodiment, material layer 152 is an HKMG layer that includes a n-type WFM embedded within a high-K dielectric material over second portion 134 of dielectric 130 in region 110 and a metal layer of TiN over the high-K dielectric material. Subsequent processing of material layer 152 may be useful to form, for example, an n-type or p-type EDMOS transistor (FIGS. 12 and 14). Material layer 152 may include either a n-type or p-type WFM embedded within the high-K dielectric material irrespective of whether subsequent processing yields an n-type or p-type EDMOS transistor (FIGS. 12 and 14). Material layer 154A includes a p-type WFM embedded within a high-K dielectric material over material layer 142 in region 106. Material layer 154B includes a n-type WFM embedded within a high-K dielectric material over dielectric layer 130 in region 108. Material layers 154A and 154B may include a metal layer of TiN over the high-K dielectric material. Subsequent processing of material layers 154A, 154B may be useful, for example, to form LV PMOS and LV NMOS devices (FIGS. 11-17) in regions 106, 108, respectively.

As further shown in FIG. 6, embodiments of the disclosure may include selectively removing portions of insulative material 140 over dielectric layer 130. Insulative material 140 may have a high selectivity of etching relative to dielectric layer 130. Selectively removing portions of insulative material 140 (FIGS. 4, 5) yields a material layer 144 on second portion 134 of dielectric layer 130. Material layer 144 may be a remaining portion of insulative material 140 under material layer 152. For example, material layer 144 may be a masking material such as, e.g., a nitride hard mask. Subsequent processing of material layer 144 and material layer 152 may yield a gate structure (FIGS. 10-12, 14).

Figure 7:
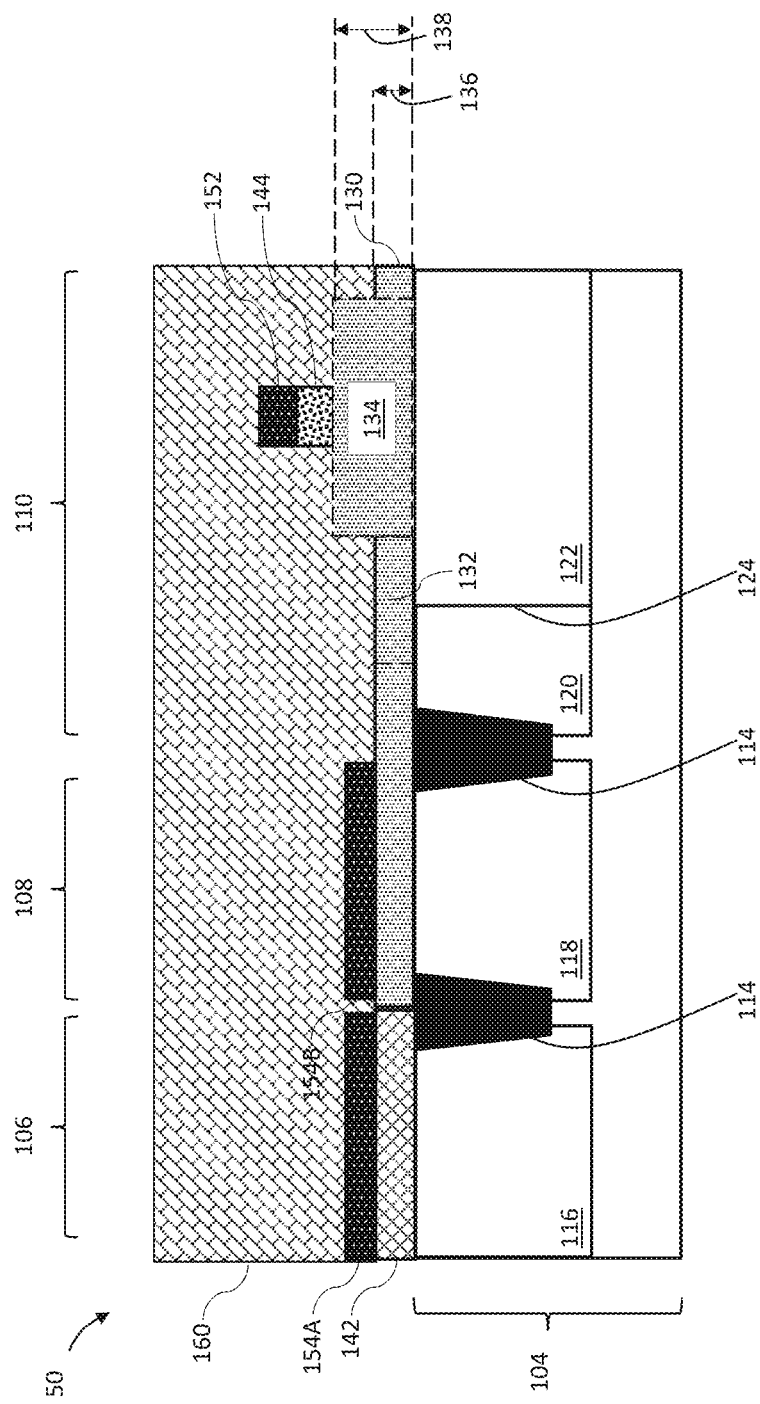
FIG. 7 shows a cross-sectional view of forming a semiconductor material layer according to embodiments of the disclosure.
Figure 8:
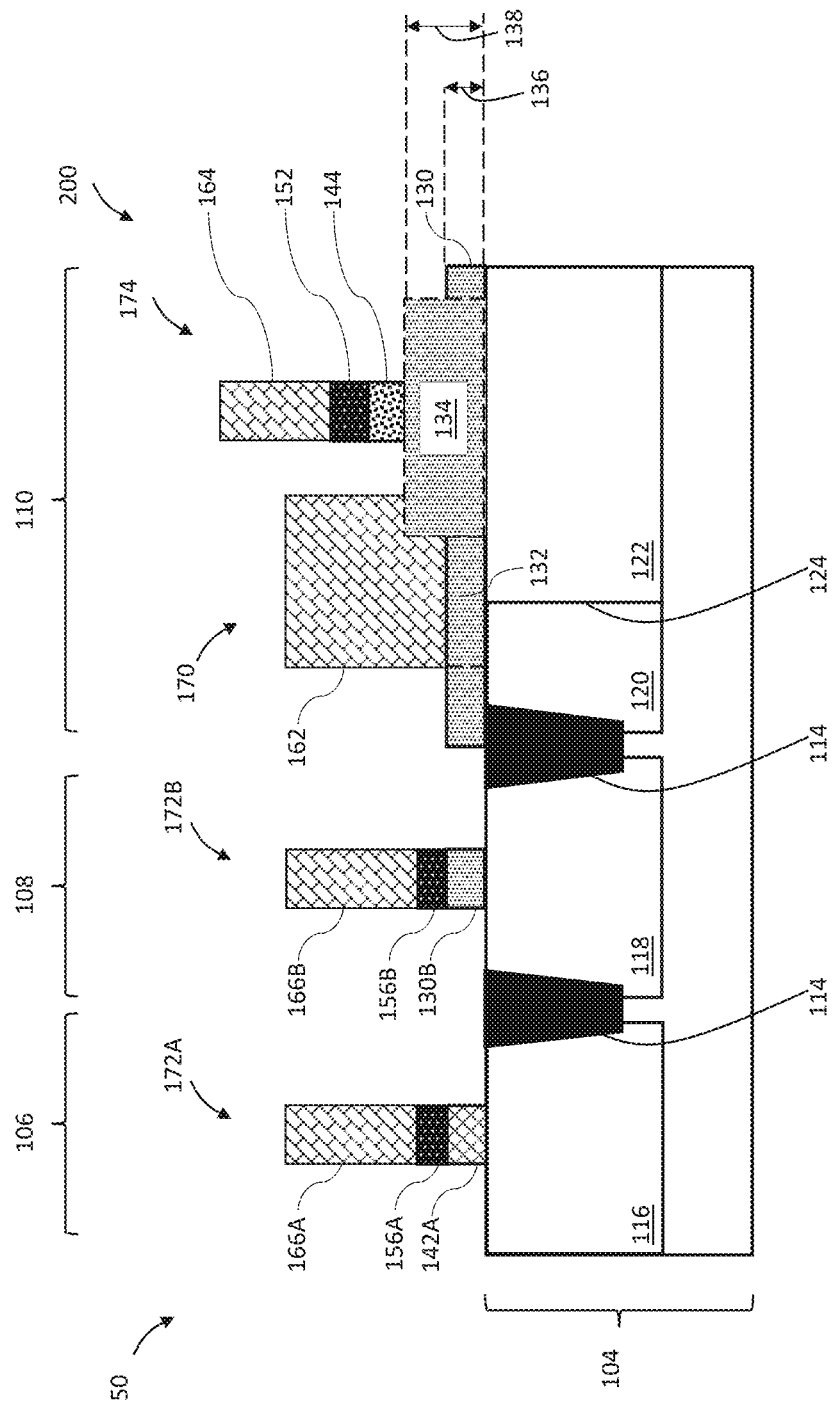
FIG. 8 shows a cross-sectional view of processing a semiconductor material layer according to embodiments of the disclosure.

Referring now to FIG. 7, embodiments of the disclosure may include depositing a semiconductor material 160 on any exposed materials to cover dielectric layer 130 and material layers 152, 154A, 154B. Semiconductor material 160 may include any semiconductor material such as, but not limited to, one or more of the following: polycrystalline silicon (poly-Si), amorphous silicon, polycrystalline silicon germanium (poly-SiGe), etc. Additional processing, e.g., etching, of semiconductor material 160 may yield one or more semiconductor material layers useful to form one or more gate structures over substrate 104. For example, as shown in FIG. 8, embodiments of the disclosure may include selectively removing portions of semiconductor material 160 to form a plurality of material layers 162, 164, 166A, and 166B. Each of the material layers 162, 164, 166A, and 166B may include a doped semiconductor material formed using any appropriate n-type or p-type dopant and may be formed using any now known or later developed technique (e.g., in-situ doping or ion implantation).

Turning to FIG. 8, embodiments of the disclosure may include selectively removing portions of semiconductor material 160 using, e.g., a mask (not shown) to yield material layer 162 on first portion 132 and second portion 134 of dielectric layer 130 over first doped well 120, second doped well 122, and well boundary 124. In other embodiments, material layer 162 is only on first portion 132 over first doped well 120, second doped well 122, and well boundary 124. Material layer 162 forms a first gate structure 170 of a transistor structure 200 in region 110. The method may also include selectively removing portions of semiconductor material 160 to yield material layer 164 over second portion 134 of dielectric layer 130 and second doped well 122. Material layer 164 may be on material layer 152. Material layers 144, 152, and 164 may form a second gate structure 174 of transistor structure 200 in region 110. Second gate structure 174 may be, for example, a field plate gate. A "field plate gate," as used herein, refers to a structure for reducing peak electric field and enhance breakdown voltage during operation of transistors. Field plate gates spread out an electric field and mitigate peaking of the electric field to achieve a desirable electrical field profile and increase breakdown voltage of a transistor.

As shown in FIG. 8, embodiments of the disclosure may include selectively removing portions of semiconductor material 160 using, e.g., a mask to yield material layers 166A and 166B over regions 106 and 108, respectively. Each material layer 166A, 166B may be formed using any appropriate n-type or p-type dopant and may be formed using any now known or later developed technique (e.g., in-situ doping or ion implantation). Material layer 166A may include a first dopant and material layer 166B may include a second dopant opposite the first dopant. Additional processing may include removing (e.g., via etch) portions of one or more material layers to yield one or more gate structures, for example, to form LV MOS transistors. As shown in FIG. 8, embodiments of the disclosure may include selectively removing portions of dielectric layer 130, material layer 142, and material layer 154A/B to yield material layer 130B, 142A, and 156A/B, respectively. In some embodiments, material layers 142A, 156A, 166A form LV PMOS transistor 172A in region 106, and material layers 130B, 156B, 166B form LV NMOS transistor 172B in region 108.

Figure 9:
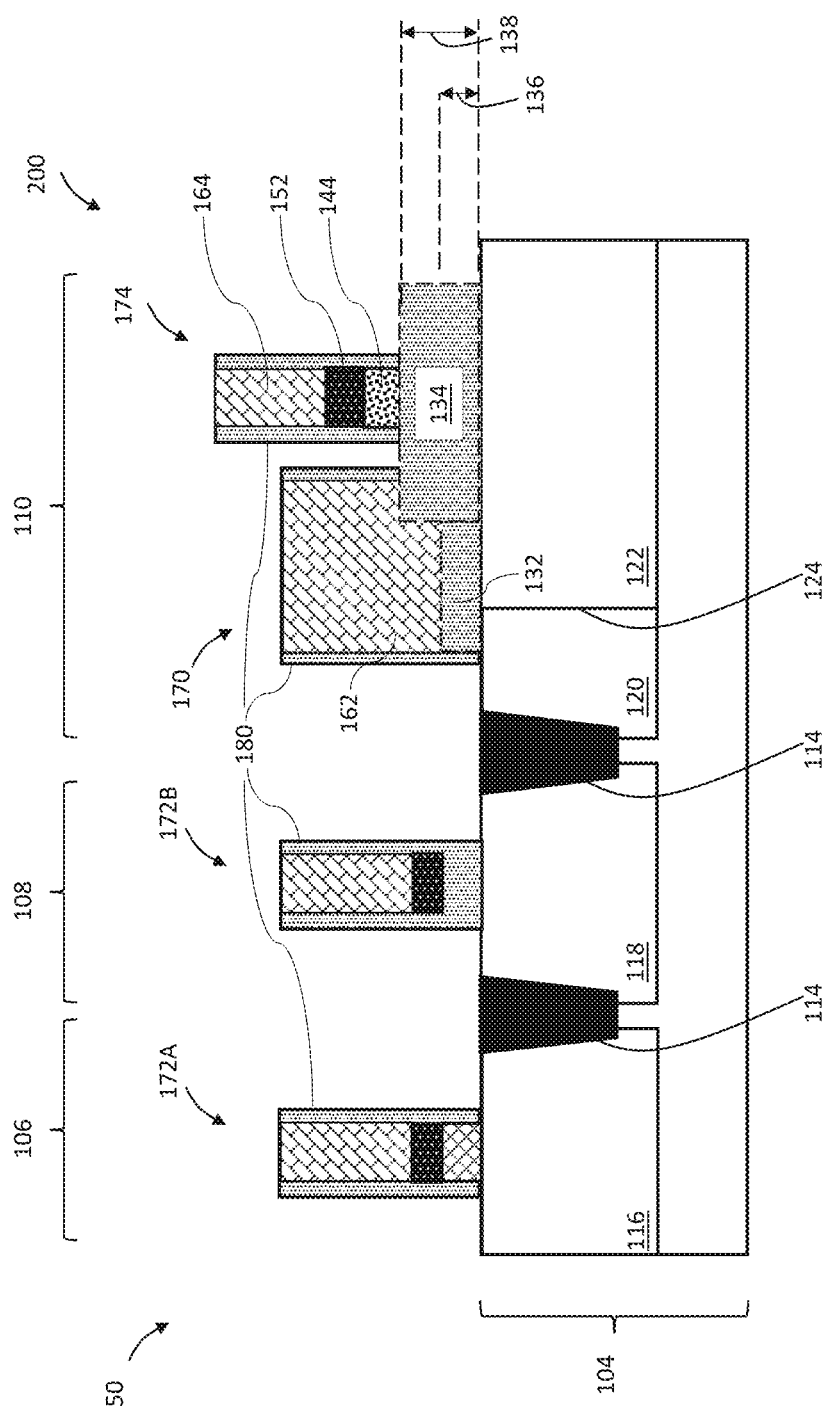
FIG. 9 shows a cross-sectional view of forming a sidewall spacer according to embodiments of the disclosure.

Turning now to FIG. 9, embodiments of the disclosure may include forming a sidewall spacer 180 on first gate structure 170, second gate structure 174, and LV MOS transistors 172A/B. Forming sidewall spacer 180 may include depositing a layer of spacer material (not shown) over exposed surfaces and selectively removing portions of deposited spacer material to form sidewall spacer 180. Sidewall spacer 180 may structurally and electrically isolate adjacent components from each other. For example, spacer 180 may electrically isolate first gate structure 170 from horizontally adjacent second gate structure 174.

Figure 10:
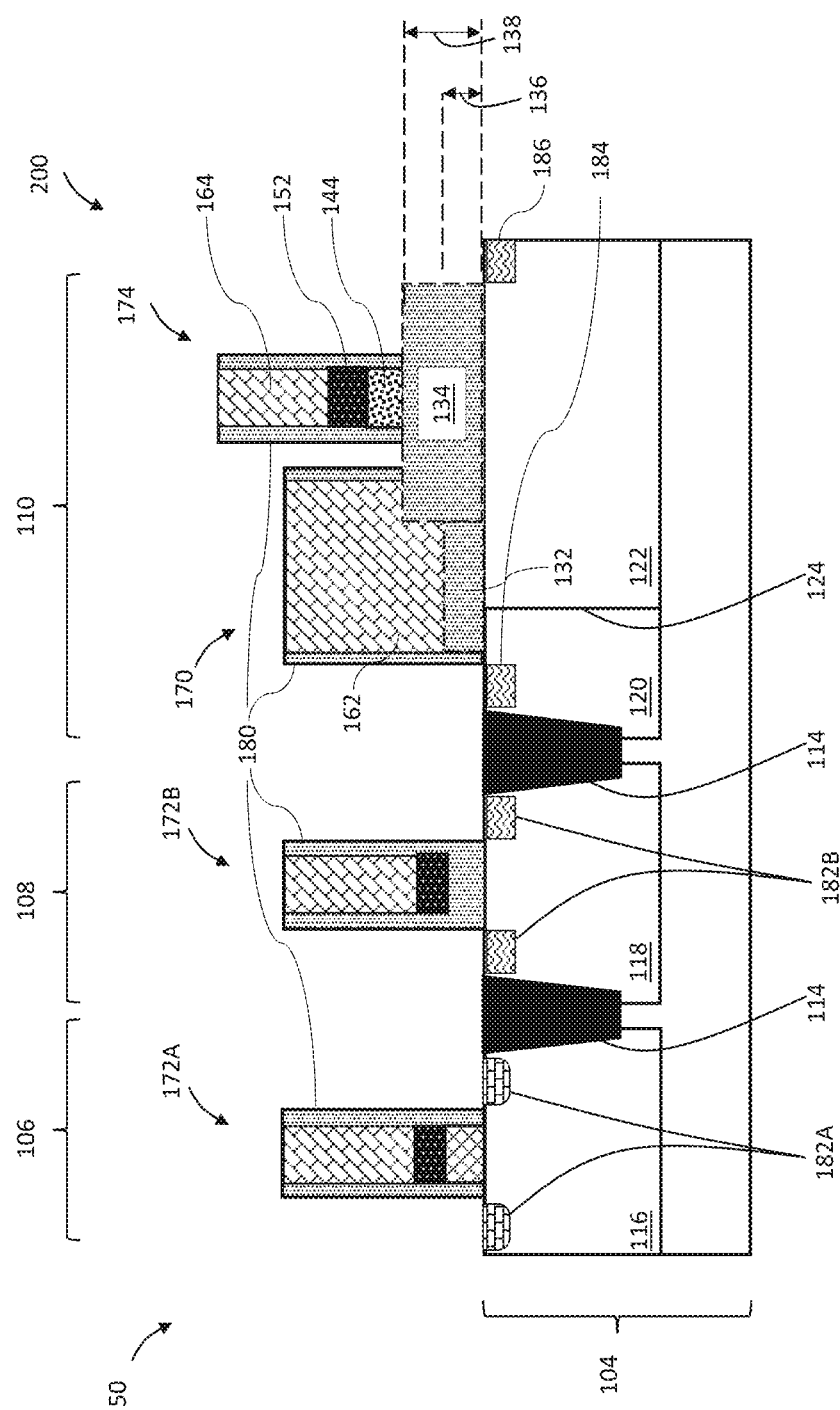
FIG. 10 shows a cross-sectional view of forming a source and drain region according to embodiments of the disclosure.

Referring now to FIG. 10, embodiments of the disclosure include forming electrically active source/drain ("S/D") regions. S/D regions are electrically active regions in a semiconductor substrate that define opposite terminals for current flow through the transistor. When a voltage is applied to the gate of the transistor, a conductive channel enables current flow between source and drain. For example, FIG. 10 shows forming a source region 184 and a drain region 186 in region 110 of substrate 104. As will be recognized, source/drain regions are doped with a dopant having a selected polarity for a respective transistor. An n-type transistor may include n-type dopants such as but not limited to: phosphorous (P), arsenic (As), antimony (Sb), and a p-type transistor may include p-type dopants such as but not limited to: boron (B), indium (In) and gallium (Ga). Similar dopants, typically with different concentrations, may be used for doped wells 116, 118, 120, 122. Any necessary thermal process may be carried out to drive in the dopants. S/D regions 182A/B for LV MOS transistors 172A/B may also be formed at this time. It is understood that processing for S/D regions may be carried out before spacer formation. S/D regions 182A/B, 184, 186 may be formed using any now known or later developed technique, e.g., in-situ doping, ion implantation, etc. S/D regions 182A/B, 184, 186 formation may include forming raised source/drain regions, e.g., by recessing substrate 104 and epitaxially growing raised regions, perhaps with in-situ doping. Dopants used may be any dopant appropriate for the transistor to be formed. Any necessary anneal to drive in dopants may be performed.

Figure 11:
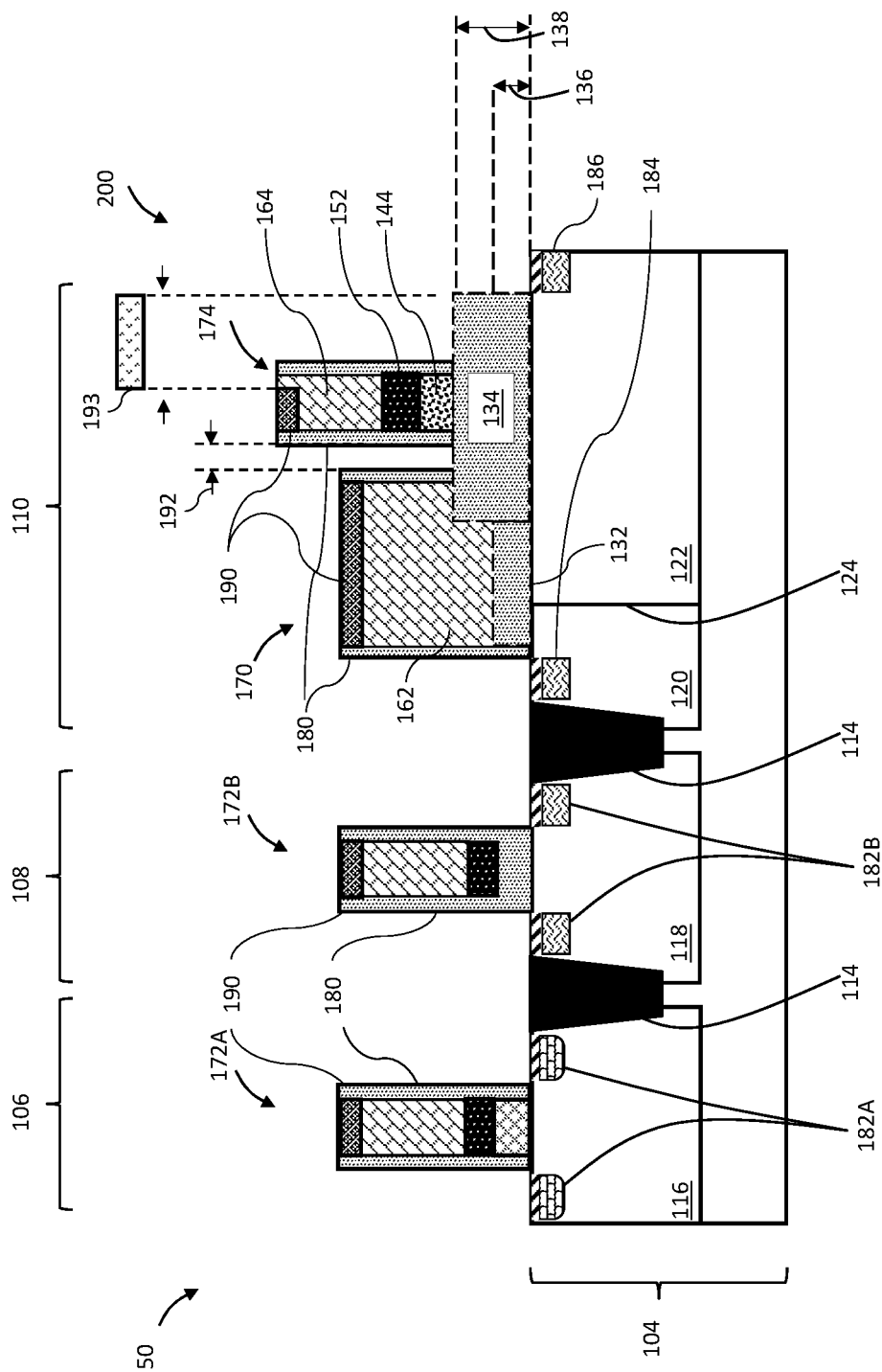
FIG. 11 shows a cross-sectional view of forming silicide according to embodiments of the disclosure.
Figure 12:
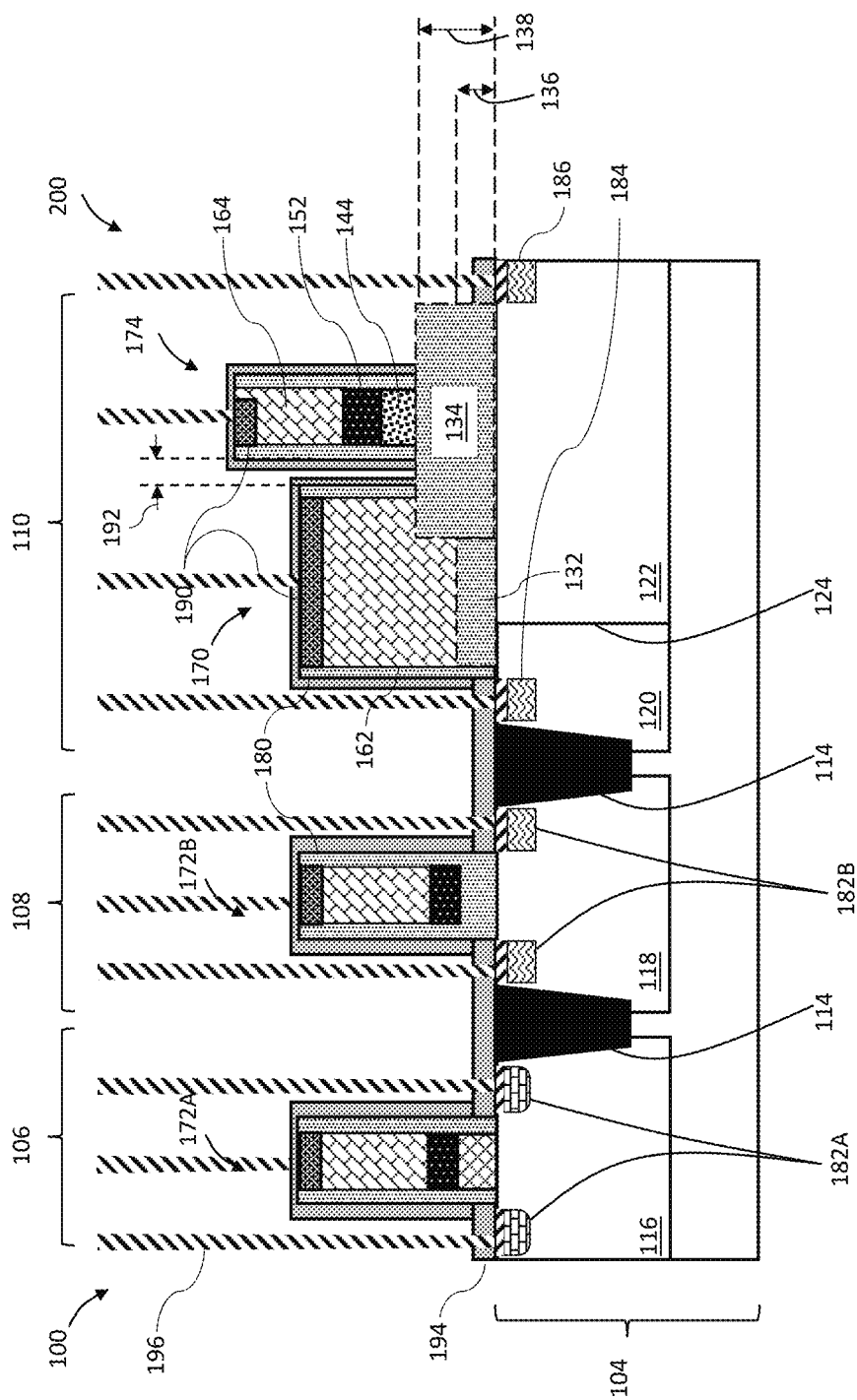
FIG. 12 shows a cross-sectional view of an integrated circuit structure according to embodiments of the disclosure.

Turning now to FIG. 11, embodiments of the disclosure may include forming a silicide layer 190 on an upper surface of first gate structure 170, second gate structure 174, LV MOS transistors 172A/B, and S/D regions 182A/B, 184, 186. Silicide layer 190 may include, for example, forming a silicide layer over a material layer to enable a respective structure to electrically couple to other electrical components (not shown). Silicide layer 190 formation may include forming a silicide block mask 193 to expose select portion(s) of preliminary structure 50 and depositing a layer of conductive metal(s) (not shown) over exposed portions of preliminary structure 50. Silicide layer 190 formation may include depositing a layer of conductive metal(s), applying a heat treatment (e.g., rapid thermal annealing) such that the conductive metal(s) combine with underlying semiconductor material, and removing any excess metal to yield silicide layer 190 on the upper surface of first gate structure 170, second gate structure 174, LV MOS transistors 172A/B, and S/D regions 182A/B, 184, 186.

As shown in FIG. 11, embodiments of the disclosure may include forming silicide block mask 193 over select portions of preliminary structure 50 to block silicide formation in select portions under silicide block mask 193. Silicide block mask 193 may prevent silicide formation between a drain side edge of second gate structure 174 and a drain region 186. Preventing silicide formation between second gate structure 174 and drain region 186 may prevent electrical shorting in transistor structure 200. For example, forming second gate structure 174 may include using silicide block mask 193 to prevent a portion of an upper surface of material layer 164 from exposure to conductive metal(s) deposition and subsequent processing yielding silicide layer 190. The horizontal span of silicide layer 190 of second gate structure 174 therefore may occupy only a portion of the upper surface of second gate structure 174 and leave a portion of material layer 164 exposed.

As further shown in FIG. 11, embodiments of the disclosure may include a separation distance 192 between first gate structure 170 and second gate structure 174. Separation distance 192 may have at least a minimum allowable lateral distance between first and second gate structures 170, 174 to prevent electrical shorts and/or other physical interference between structures 170, 174. In some embodiments, separation distance 192 is less than approximately 60 nanometers (nm).

Referring now to FIG. 12, embodiments of the disclosure may include additional processing to form IC structure 100. The method may include, for example, depositing a stress liner 194 over exposed surfaces and forming one or more contacts 196. Stress liner 194 may include one or more stress liners such as, but not limited to, one or more of the following: tensile stress liner for NMOS transistors, compressive stress liner for PMOS transistors, or neutral stress liners. Stress liner 194 may act as an etch stop layer when forming contacts 196. Any appropriate middle-of-line and back-end-of-line processing carried out to form contacts 196 to gate structures 170, 172A/B, 174 and S/D regions 182A/B, 184, 186. As the processes to form stress liners and contacts are well known, no further details will be provided. Any necessary etch stop layers, e.g., single, or dual contact etch stop layers, may be employed, and any silicidation can be carried out as known in the field as part of the processes.

FIG. 12 depicts one embodiment of IC structure 100 having transistor structure 200. In the present embodiment, transistor structure 200 is a high voltage EDMOS (HV EDMOS) transistor in doped well region 110 that includes first doped well 120 adjacent second doped well 122 at well boundary 124 in substrate 104. First doped well 120 includes a first dopant type and second doped well 122 includes a second dopant type opposite the first dopant type. First doped well 120 includes a p-type dopant and second doped well 122 includes an n-type dopant to form an n-type HV EDMOS transistor. Alternatively, or additionally in an adjacent transistor (not shown), first doped well 120 and second doped well 122 form a p-type HV EDMOS transistor. Transistor structure 200 includes first gate structure 170 and second gate structure 174 over dielectric layer 130. First gate structure 170 is on first and second portions 132 of dielectric layer 130, and over first doped well 120, second doped well 122, and well boundary 124. Second gate structure 174 is on second portion 134 and over second doped well 122. First and second gate structures 170, 174 each include silicide layer 190 to electrically couple transistor structure 200 to other electrical components via contacts 196. As further shown in FIG. 12, embodiments of the disclosure may include forming one or more transistors configured for different voltage requirements (e.g., logic transistors) adjacent transistor structure 200. For example, IC structure 200 includes a plurality of logic transistors (e.g., LV PMOS transistor 172A and LV NMOS transistor 172B) in regions 106, 108 horizontally adjacent to region 110 that includes transistor structure 200.

Figure 13:
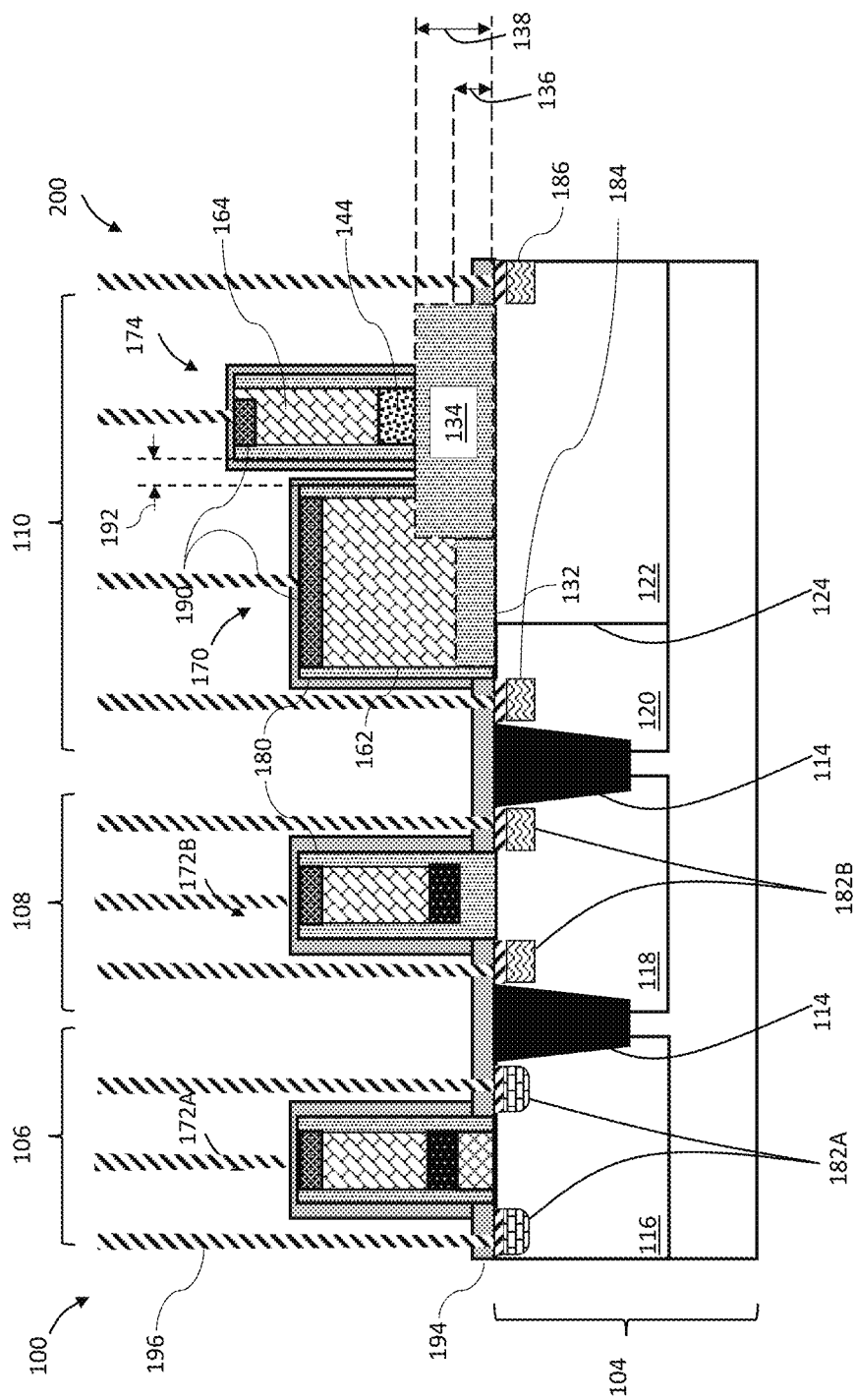
FIG. 13 shows a cross-sectional view of an integrated circuit structure according to embodiments of the disclosure.
Figure 14:
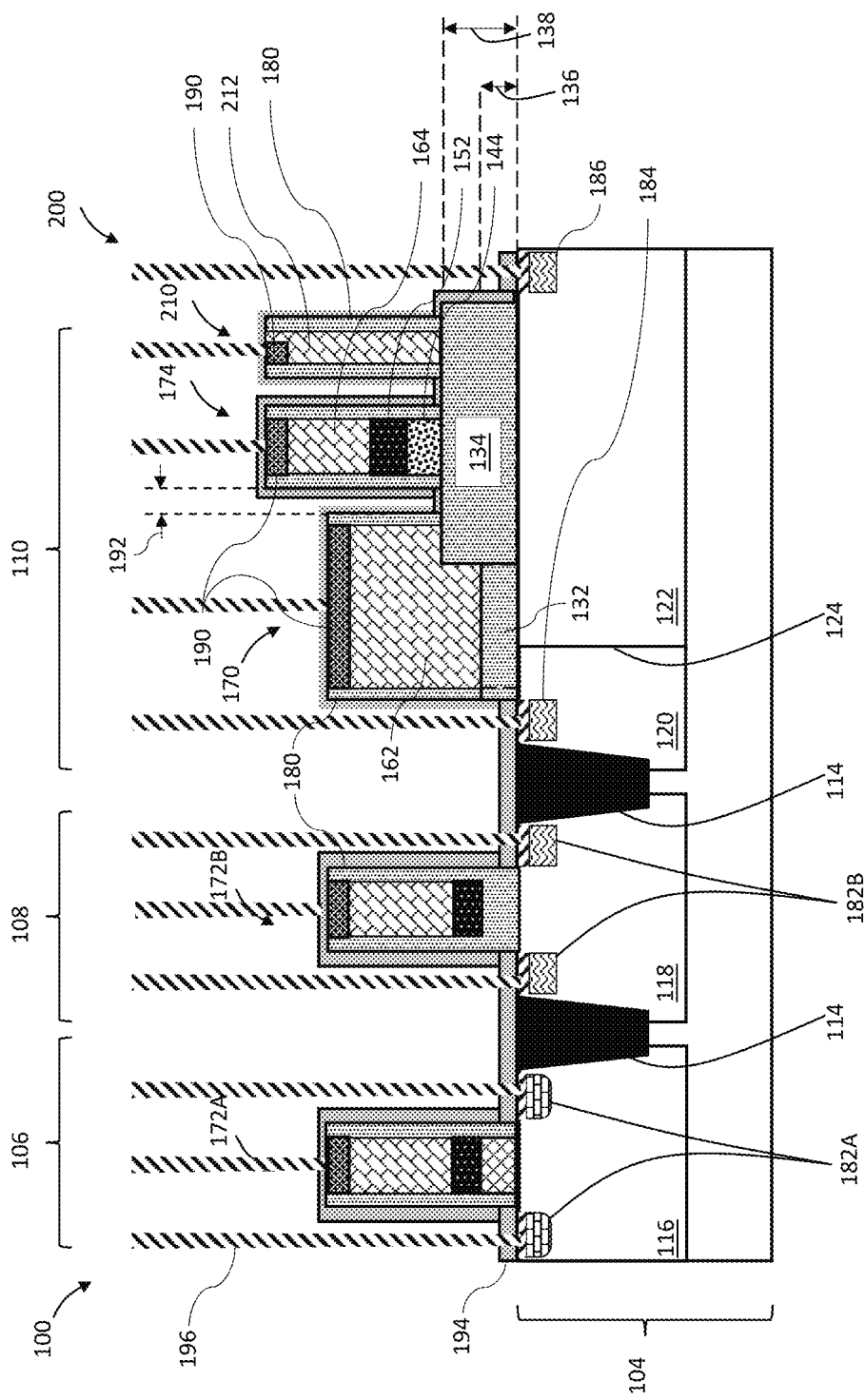
FIG. 14 shows a cross-sectional view of an integrated circuit structure according to embodiments of the disclosure.

FIG. 13 depicts another embodiment of IC structure 100 including transistor structure 200 having second gate structure 174 that includes material layer 164 on material layer 144. IC structure 100 is substantially similar to the embodiment described in FIG. 12. A possible distinction between the embodiments is that second gate structure 174 in FIG. 13 includes material layer 164 on material layer 144 and therefore does not include an HKMG layer such as, e.g., material layer 152.

Referring now to FIG. 14, another embodiment of IC structure 100 including transistor structure 200 having a third gate structure 210 is shown. IC structure 100 is substantially similar to the embodiment described in FIG. 12. A distinction between the embodiments is that transistor structure 200 in FIG. 14 includes third gate structure 210. Third gate structure 210 includes a material layer 212, sidewall spacer 180, and silicide layer 190 over second portion 134 of dielectric layer 130. Forming third gate structure 210 may include selectively recessing material layer 160 (FIG. 7) to form material layer 212 on second portion 134 of dielectric layer 130 by using a mask to expose a target portion of dielectric layer 130. Forming third gate structure 210 may also include depositing material to form sidewall spacer 180 (FIG. 9) and depositing conductive metal(s) to form silicide layer 190 (FIG. 11) using substantially similar processes as previously described regarding first and second gate structures 170, 174. Forming third gate structure may include using a silicide blocking mask (not shown) to prevent a portion of the upper surface of material layer 212 from exposure to conductive metal(s) and subsequent processing yielding silicide layer 190. The horizontal span of silicide layer 190 of third gate structure 210 therefore may occupy only a portion of the upper surface of third gate structure 210 and leave a portion of material layer 212 exposed. Additional processing may include forming contact 196 to electrically couple third gate structure to other electrical components (not shown). Third gate structure 210 may be a may be a control/switching gate in transistor structure 200. A max operating voltage of third gate structure 210 may depend on second height 138 of second portion 134 of dielectric layer 130. First and third gate structures 170, 210 may turn on and off simultaneously during operation. First gate structure 170 may receive a first operating voltage and third gate structure 210 may receive a second operating voltage different than the first operating voltage. In alternative embodiments, first and third gate structures 170, 210 receive a same operating voltage.

As shown in FIG. 14, embodiments of the disclosure may include forming second gate structure 174 laterally between first gate structure 170 and third gate structure 210. In some embodiments that include third gate structures 210, forming silicide layer 190 may include forming a silicide blocking mask (not shown) to expose material layer 164 of second gate structure 174 and a portion of material layer 212 of third gate structure 210. The horizontal span of silicide layer 190 of second gate structure 174 therefore includes all, or substantially all, of the upper surface of material layer 164. The horizontal span of silicide layer 190 of third gate structure 210 therefore may occupy only a portion of the upper surface of third gate structure 210 and leave a portion of material layer 212 exposed. The method may include a silicide block mask that prevents silicide formation between a drain side edge of third gate structure 210 and a drain region 186.

Figure 15:
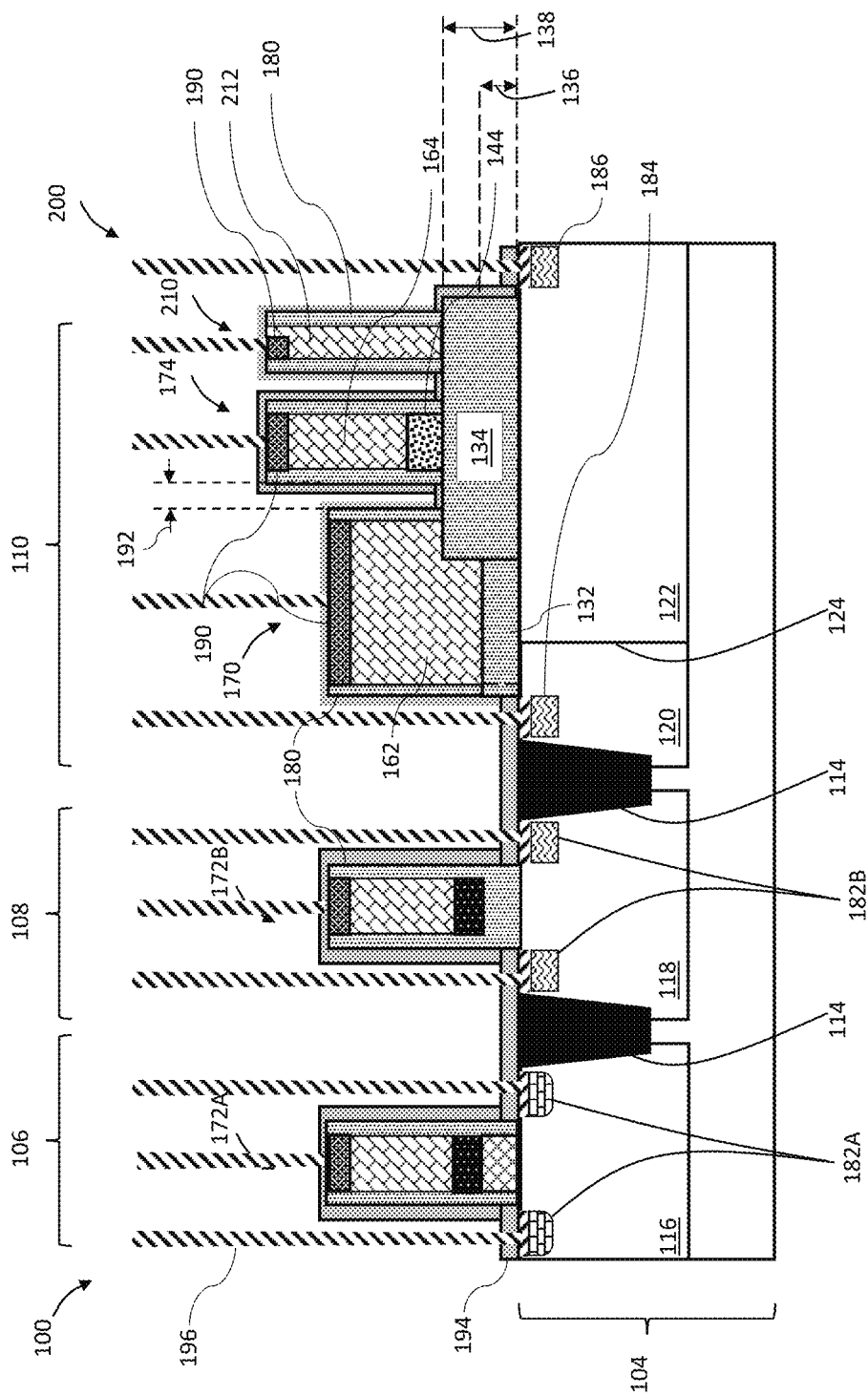
FIG. 15 shows a cross-sectional view of an integrated circuit structure according to embodiments of the disclosure.

Referring now to FIG. 15, another embodiment of IC structure 100 including transistor structure 200 having third gate structure 210 is shown. IC structure 100 is substantially similar to the embodiment described in FIG. 14. A possible distinction between the embodiments is that second gate structure 174 in FIG. 15 includes material layer 164 on material layer 144 and does not include an HKMG layer such as, e.g., material layer 152.

Figure 16:
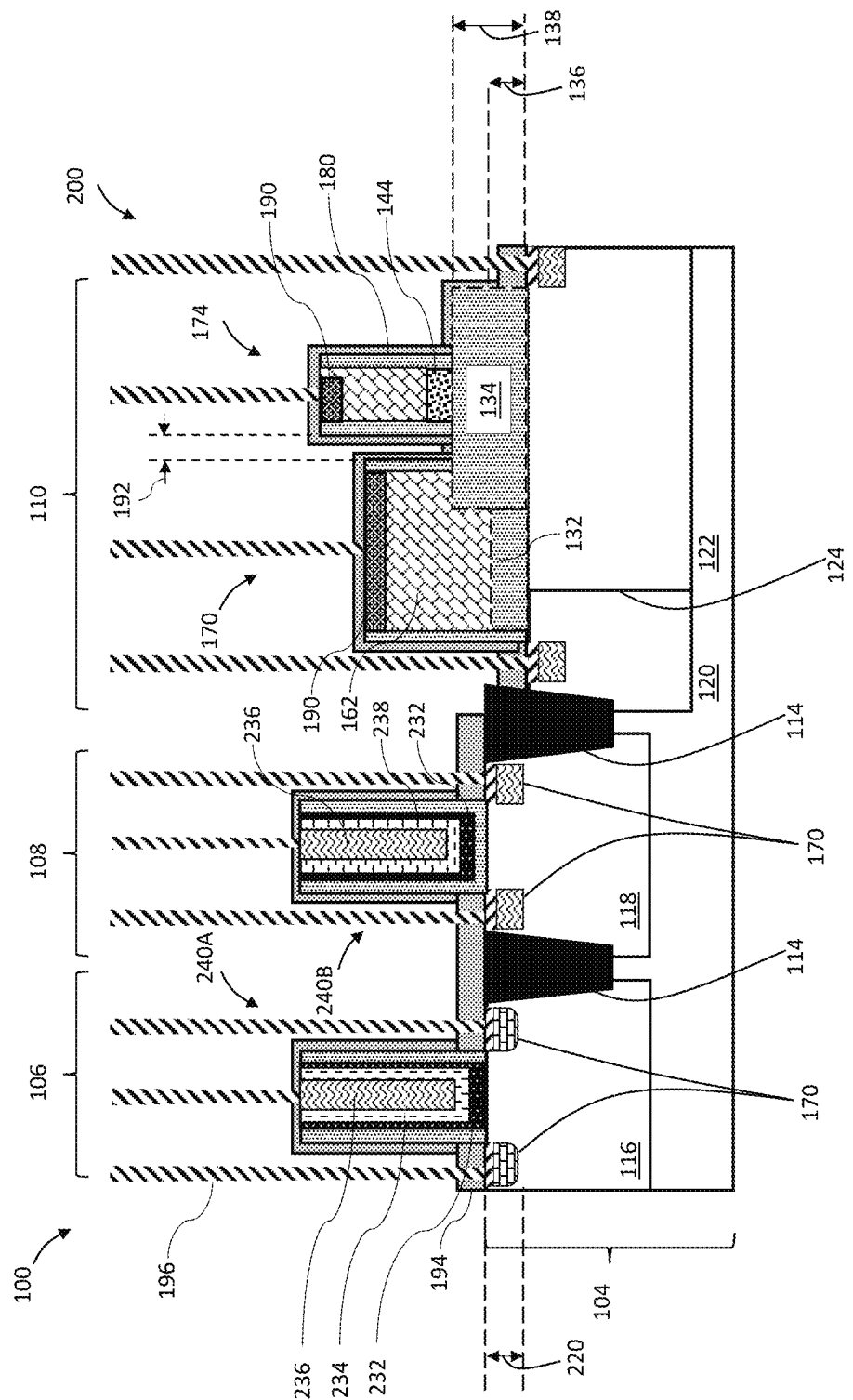
FIG. 16 shows a cross-sectional view of an integrated circuit structure having a recess region according to embodiments of the disclosure.

Referring now to FIG. 16, another embodiment of IC structure 100 including transistor structure 200 formed in a recess 220 of substrate 104 is shown. Transistor structure 200 is formed in a recessed active region of substrate 104. Forming transistor structure 200 may include selectively removing portions of substrate 104 prior to depositing dielectric layer 130 (FIG. 1) over substrate 104 to form recess 220 in region 110. Forming recess 220 may include using, e.g., a mask (not shown) with an opening at a targeted position to expose a region (e.g., region 110) of substrate 104. Forming transistor structure 200 in recess 220 may prevent HKMG formation over transistor structure 200 using a gate-last process.

As shown in FIG. 16, embodiments of the disclosure may include forming metal gate structures 240A, 240B adjacent transistor structure 200 in regions 106, 108. Metal gate structures 240A, 240B may be formed by known replacement metal gate processing techniques. Metal gate structures may include, for example, LV PMOS or LV NMOS transistors. Metal gate structure 240A may include a plurality of material layers 232, 234, 236, and metal gate structure 240B may also include a plurality of material layers 232, 238, 236. Material layer 232 may include a high-K dielectric material, and material layer 236 may include a metal such as, e.g., aluminum. Material layer 234 may include a first WFM and material layer 238 may include a second WFM of a different WFM type than material layer 234. For example, material layer 234 may include a p-type WFM and material layer 236 may include a n-type WFM.

Figure 17:
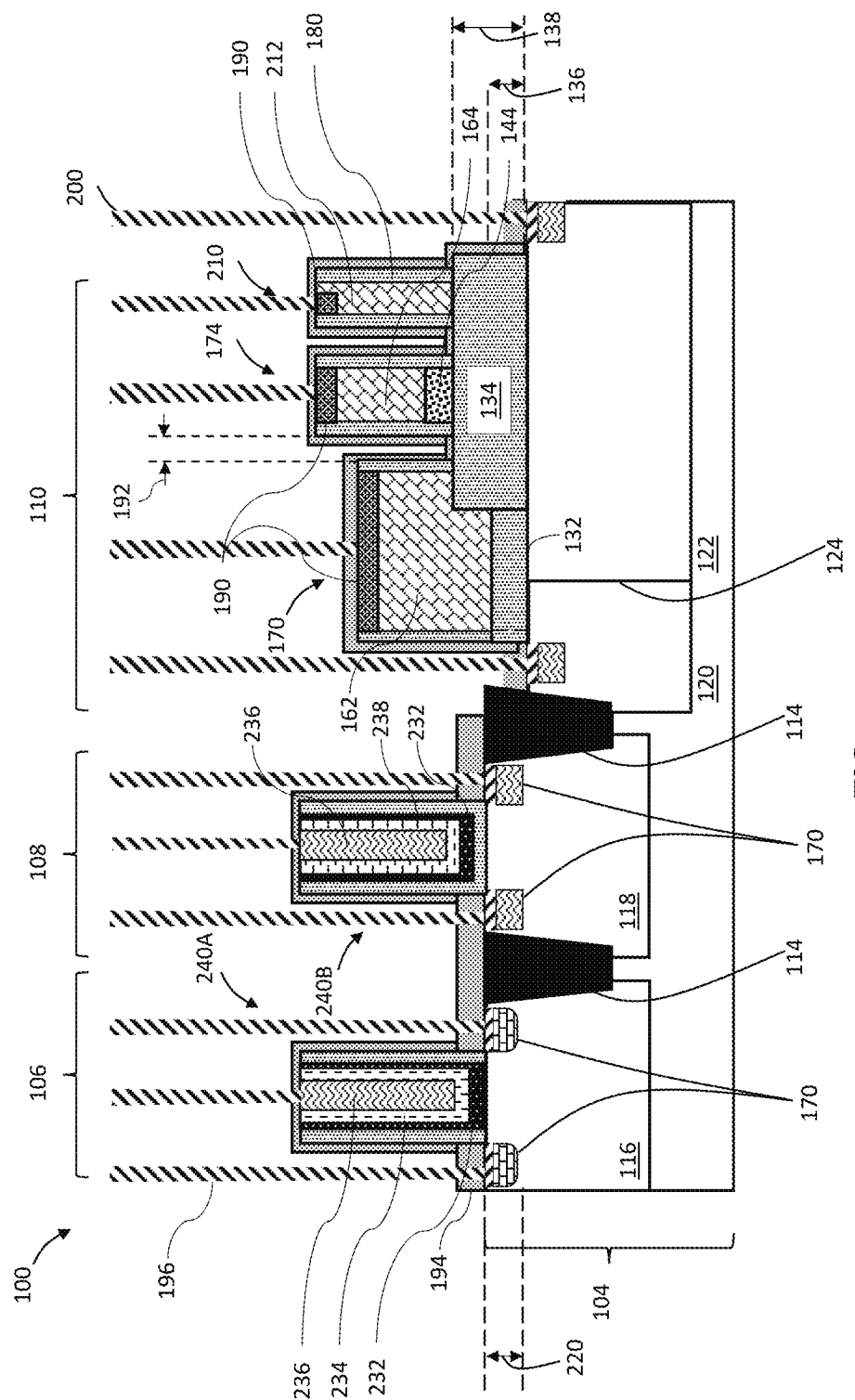
FIG. 17 shows a cross-sectional view of an integrated circuit structure having a recess region according to embodiments of the disclosure.

Referring now to FIG. 17, another embodiment of IC structure 100 including transistor structure 200 having third gate structure 210 formed in recess 220 is shown. Transistor structure 200 may include third gate structure 210 as shown in FIG. 15. IC structure 100 may include one or more transistors adjacent transistor structure 200 in, for example, regions 106, 108.

Embodiments of the present invention provide technical and commercial advantages, and some examples of such advantages are described herein. Embodiments of the disclosure may improve operational performance for several types of transistors, such as HV EDMOS transistors. The HKMG region in, for example, an HV EDMOS transistor have multiple charge trapping sites that contribute to charge trapping during operation of the HV EDMOS transistor. Embodiments of the disclosure may avoid charge trapping by preventing high-K dielectric layer formation in switching gates such as, e.g., first and third gate structures 170, 210. Recessing substrate 104 may prevent HKMG formation in first, second, and/or third gate structures 170, 174, 210 in transistor structure 200. Second gate structure 174 may act as a field plate gate for breakdown voltage improvement and peak field reduction at drain-side gate edge. A positive bias to third gate structure 210 may improve surface electron density in a drift region and, hence, drive current and switching speed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing structures as part of either (a) an intermediate product, such as a motherboard, or (b) an end product. The end product can be any product that includes integrated circuit chips, ranging from toys and other low-end applications to advanced computer products having a display, a keyboard or other input structure, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A transistor structure, comprising:
  a doped well region within a substrate, the doped well region including a first doped well abutting a second doped well at a boundary, wherein the first doped well has an opposite doping type from the second doped well;
  a dielectric layer, including:
    a first portion over the first doped well, the second doped well, and the boundary and having a first height above the doped well region, and
    a second portion immediately adjacent the first portion and over the second doped well, and having a second height above the doped well region greater than the first height;
  a first gate structure on the first portion of the dielectric layer and over the boundary between the first doped well and the second doped well; and
  a second gate structure on the second portion of the dielectric layer and over the second doped well,
  wherein the second portion of the dielectric layer is under the first gate structure and the second gate structure.

2. The transistor structure of claim 1, wherein the first portion of the dielectric layer includes a thermal oxide.

3. The transistor structure of claim 1, wherein the second portion of the dielectric layer includes a high voltage gate oxide.

4. The transistor structure of claim 1, wherein a separation distance between the first gate structure and the second gate structure is less than approximately 60 nanometers (nm).

5. The transistor structure of claim 1, wherein a portion of the first gate structure is immediately on the second portion of the dielectric layer.

6. The transistor structure of claim 1, wherein the second gate structure further includes:
  an insulative material over the second portion of the dielectric layer,
  a high-K metal gate (HKMG) layer over the insulative material, the HKMG layer including a work function metal (WFM) embedded within a high-K dielectric material and a metal layer over an upper surface of the high-K dielectric material, and
  a doped semiconductor material over the HKMG layer.

7. The transistor structure of claim 6, wherein the first gate structure does not include the HKMG layer.

8. The transistor structure of claim 6, wherein the insulative material of the second gate structure includes a masking material.

9. A transistor structure, comprising:
  a doped well region within a substrate, the doped well region including a first doped well abutting a second doped well at a boundary, wherein the first doped well has an opposite doping type from the second doped well;
  a dielectric layer, including:
    a first portion over the first doped well, the second doped well, and the boundary and having a first height above the doped well region, and
    a second portion immediately adjacent the first portion and over the second doped well, and having a second height above the doped well region greater than the first height;
  a first gate structure on the first portion of the dielectric layer and over the boundary between the first doped well and the second doped well;
  a second gate structure on the second portion of the dielectric layer and over the second doped well,
  wherein the second portion of the dielectric layer is under the first gate structure and the second gate structure; and
  a third gate structure on the second portion of the dielectric layer and over the second doped well,
  wherein the second gate structure is laterally positioned between the first gate structure and the third gate structure.

10. The transistor structure of claim 9, wherein the first portion of the dielectric layer includes a thermal oxide, and the second portion of the dielectric layer includes a high voltage gate oxide.

11. The transistor structure of claim 9, wherein a separation distance between the first gate structure and the second gate structure is less than approximately 60 nanometers (nm).

12. The transistor structure of claim 9, wherein the second gate structure further includes:
  an insulative material over the second portion of the dielectric layer,
  a high-K metal gate (HKMG) layer over the insulative material, the HKMG layer including a work function metal (WFM) embedded within a high-K dielectric material and a metal layer over an upper surface of the high-K dielectric material, and
  a doped semiconductor material over the HKMG layer.

13. The transistor structure of claim 12, wherein the first gate structure and the third gate structure do not include the HKMG layer.

14. The transistor structure of claim 9, wherein each of the first gate structure, second gate structure, and third gate structure further includes a doped semiconductor material including at least one of amorphous silicon and polycrystalline silicon.

15. A method comprising:
  forming a transistor structure including:
    forming a doped well region within a substrate, the doped well region including a first doped well abutting a second doped well at a boundary, wherein the first doped well has an opposite doping type from the second doped well;
    forming a dielectric layer, including:
      a first portion over the first doped well, the second doped well, and the boundary and having a first height above the doped well region, and a second portion immediately adjacent the first portion and over the second doped well, and having a second height above the doped well region greater than the first height;

forming a first gate structure on the first portion of the dielectric layer and over the boundary between the first doped well and the second doped well, wherein the second portion of the dielectric layer is under the first gate structure and the second gate structure; and forming a second gate structure on the second portion of the dielectric layer and over the second doped well.

16. The method of claim 15, further comprising:

forming a recessed active region in the substrate; and forming the doped well region within the recessed active region of the substrate.

17. The method of claim 15, wherein forming the second gate structure includes forming a high-K metal gate (HKMG) layer over the second portion of the dielectric layer, the HKMG layer including a work function metal (WFM) embedded within a high-K dielectric material and a metal layer over an upper surface of the high-K dielectric material.

18. The method of claim 15, wherein forming the transistor structure further includes:

forming a third gate structure on the second portion of the dielectric layer and over the second doped well, wherein the second gate structure is laterally positioned between the first gate structure and the third gate structure.

19. The method of claim 15, wherein forming the first portion of the dielectric layer includes forming a thermal oxide and forming the second portion of the dielectric layer includes forming a high voltage gate oxide.

20. The method of claim 15, further comprising forming a silicide blocking mask over at least a portion of the second gate structure.

* * * * *